US012740182B2

(12) United States Patent
Chang

(10) Patent No.: US 12,740,182 B2
(45) Date of Patent: Sep. 15, 2026

(54) PHOTOCELL DEVICE HAVING RESPONSIVITY AMPLIFYING STRUCTURE

(71) Applicant: Pipal Technology Corporation, Hsinchu County (TW)

(72) Inventor: Wei-Chung Chang, Hsinchu County (TW)

(73) Assignee: Pipal Technology Corporation, Hsinchu County (TW)

( * ) Notice: Subject to any disclaimer, the term of this patent is extended or adjusted under 35 U.S.C. 154(b) by 115 days.

(21) Appl. No.: 18/935,684

(22) Filed: Nov. 4, 2024

(65) Prior Publication Data

US 2025/0151456 A1 May 8, 2025

(30) Foreign Application Priority Data

Nov. 6, 2023 (TW) ................................ 112142589

(51) Int. Cl.
*H10F 77/40* (2025.01)
*H10F 30/10* (2025.01)
*H10F 77/30* (2025.01)

(52) U.S. Cl.
CPC .......... *H10F 77/496* (2025.01); *H10F 30/10* (2025.01); *H10F 77/331* (2025.01)

(58) Field of Classification Search
CPC ...... H10F 77/496; H10F 30/10; H10F 77/331; H10F 77/413
See application file for complete search history.

(56) References Cited

U.S. PATENT DOCUMENTS 9,146,419 B1 * 9/2015 Anandan ............. G02B 6/0073

FOREIGN PATENT DOCUMENTS

TW 365443 U1 * 7/1997
TW 365443 U 7/1999
TW 200915551 A 4/2009

* cited by examiner

*Primary Examiner* — Kiho Kim
(74) *Attorney, Agent, or Firm* — Huan-Yi Lin

(57) ABSTRACT

The present invention discloses a photocell device with a responsivity amplifying structure, comprising: a partially reflective filter layer that transmits light within a specific wavelength range and reflects other wavelengths; a gain layer that interacts with photons to alter their wavelength; and an optoelectronic reaction layer. The gain layer is positioned between the partially reflective filter layer and the reaction layer. Photons interacting with the gain layer either enter the reaction layer for conversion or are reflected back for interacting with the gain layer again and then entering the reaction layer for conversion. In another embodiment, an additional reflective filter is placed between the gain layer and the optoelectronic reaction layer.

8 Claims, 5 Drawing Sheets

PHOTOCELL DEVICE HAVING RESPONSIVITY AMPLIFYING STRUCTURE

CROSS REFERENCE

The present invention claims priority to TW 112142589 filed on Nov. 6, 2023.

BACKGROUND OF THE INVENTION

Field of Invention

The present invention relates to a photocell device having a responsivity amplifying structure, particularly, it relates to such photocell device having a responsivity amplifying structure which significantly enhances the photoelectric conversion efficiency of the photocell device by utilizing a unique gain layer.

Description of Related Art

Photocell devices, including photodiodes and phototransistors, operate by photon impact on a specific material layer. When an electron within this material layer absorbs the energy of a photon, and this energy is greater than or equal to the relevant energy threshold, the electron gains sufficient energy to escape from the material layer, becoming a photoelectron. If the energy is insufficient, the electron will release energy, which ultimately dissipates as waste heat.

Referring to FIG. 1, it shows the basic structure of a prior art photocell device, which includes a filter layer 101 and an optoelectronic reaction layer 103. Light with a specific wavelength (indicated by the small arrow) in the light beam (indicated by the large arrow) passes through the filter layer 101 and strikes the optoelectronic reaction layer 103. Some electrons in the optoelectronic reaction layer 103 acquire sufficient energy to become photoelectrons (as shown by the circles in the figure), while other electrons, due to insufficient energy acquisition, fail to undergo effective photoelectric conversion and revert to photons. These photons are ultimately absorbed by the material, becoming useless waste heat.

From the above, it is understood that for a certain amount of incident light, the photoelectric effect can only achieve a certain percentage of photoelectric conversion efficiency (also referred to as "responsivity" in this specification), which is less than 100%.

Although research into the materials of the filter layer 101 and the optoelectronic reaction layer 103 can slightly improve the aforementioned photoelectric conversion efficiency, the efficiency in prior art remains unsatisfactory.

In view of the above, the present invention provides a photocell device having a responsivity amplifying structure, which significantly enhances the photoelectric conversion efficiency of the photocell device by utilizing a unique gain layer.

SUMMARY OF THE INVENTION

In one perspective, the present invention provides a photocell device having a responsivity amplifying structure, comprising: a partially reflective filter layer, which is highly transmissive for light within a specific wavelength range but reflective for light outside the specific wavelength range; a gain layer, which is configured to interact with photons to alter wavelength of the photons; and an optoelectronic reaction layer; wherein the gain layer is located between the partially reflective filter layer and the optoelectronic reaction layer; wherein when a photon interacts with the gain layer, one or more photons of a different wavelength are generated and enter the optoelectronic reaction layer for optoelectronic conversion, or are reflected by the partially reflective filter layer to enter the optoelectronic reaction layer for optoelectronic conversion.

From another perspective, the present invention provides a photocell device having a responsivity amplifying structure, comprising: a first partially reflective filter layer, which is highly transmissive for light within a specific wavelength range but reflective for light outside the specific wavelength range; a gain layer, which is configured to interact with photons to alter the wavelength of the photons; a second partially reflective filter layer, which is reflective for light within the specific wavelength range but highly transmissive for light outside the specific wavelength range; and an optoelectronic reaction layer; wherein the gain layer is located between the first and second partially reflective filter layers, and the second partially reflective filter layer is located between the gain layer and the optoelectronic reaction layer; wherein when a photon passes through the first partially reflective filter layer and enters the gain layer, it interacts with the gain layer to generate one or more photons of a different wavelength that enter the optoelectronic reaction layer for optoelectronic conversion; when a photon passes through the first partially reflective filter layer and enters the gain layer, it can be reflected by the second partially reflective filter layer and re-enter the gain layer to interact with it, generating one or more photons of a different wavelength that enter the optoelectronic reaction layer for optoelectronic conversion.

In one embodiment, the level shift transistor, the display transistor, and the bias transistor are coupled in a common-cathode structure, and the level shift transistor, the display transistor, and the bias transistor are all P-type metal oxide semiconductor (PMOS) devices.

In one embodiment, the specific wavelength range of light is in a short wavelength range.

In one embodiment, the specific wavelength range of light is within a range of 200 to 400 nm.

In one embodiment, the partially reflective filter layer is a multilayer composite film formed by combining different dielectric materials or combining dielectric materials with metallic materials.

In one embodiment, the material of the gain layer comprises one or more of the following: ZnS; ZnxCd(1−x)S; CdS; CdSe; CuInS2-CdS; Sr2SiO4 doped with Eu2+; Y3Al5O12 doped with Ce3+; Ca2SiS4 doped with rare-earth ions; Ba2SiS4 doped with rare-earth ions; Y3S2OF3 doped with rare-earth ions; La2CaF4S doped with rare-earth ions; or La2SrF4S doped with rare-earth ions; wherein the doped rare-earth ions comprise Mn2+, Ce3+, or Eu2+.

In one embodiment, the gain layer is filled with up-conversion nanoparticles.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the layers, while the shapes, thicknesses, and widths are not drawn in actual scale.

Figure 1:
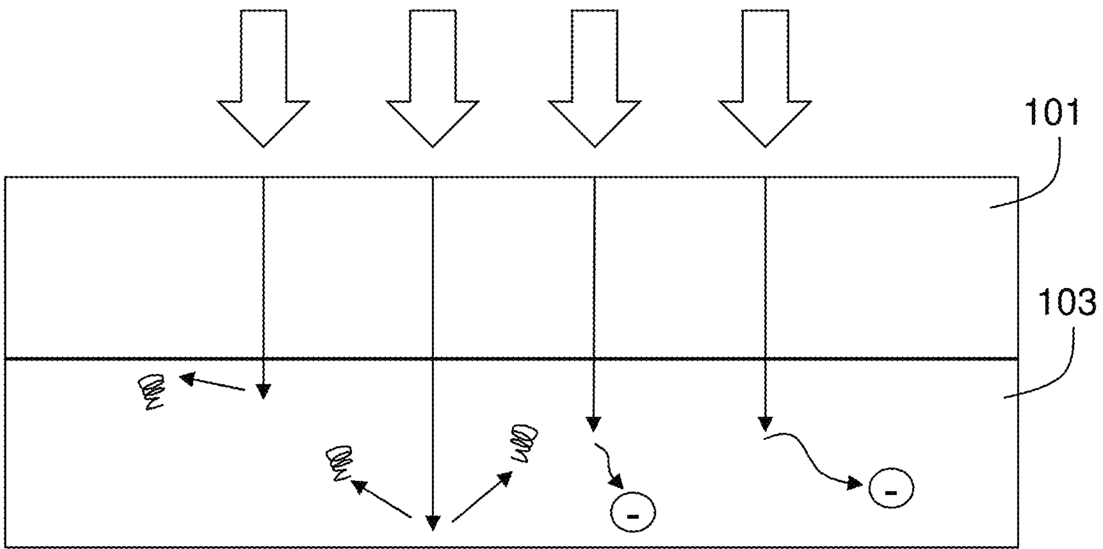
FIG. 1 shows a basic structure of a prior art photocell device.
Figure 2:
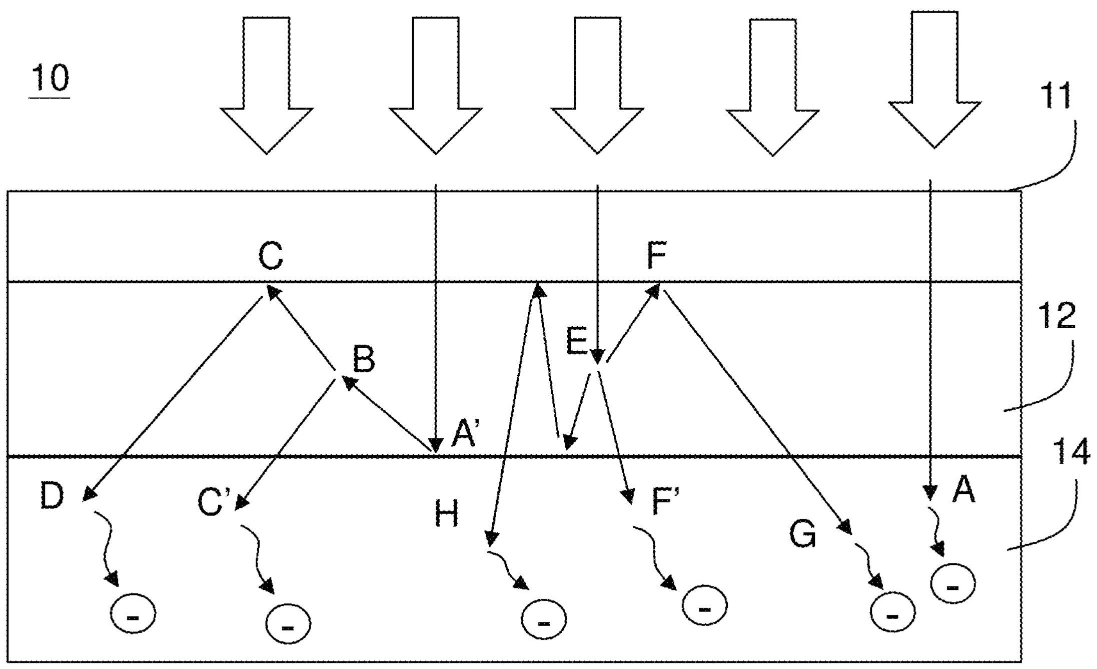
FIG. 2 shows an embodiment of the photocell device according to the present invention.

FIG. 2 shows an embodiment of the photocell device having a responsivity amplifying structure according to the present invention. The photocell device may be, for example, a photodiode or phototransistor. This embodiment may be applied to photocell devices that require responsivity to light in the short-wavelength range (for example, but not limited to, light in the wavelength range of 200-400 nm).

Figure 3:
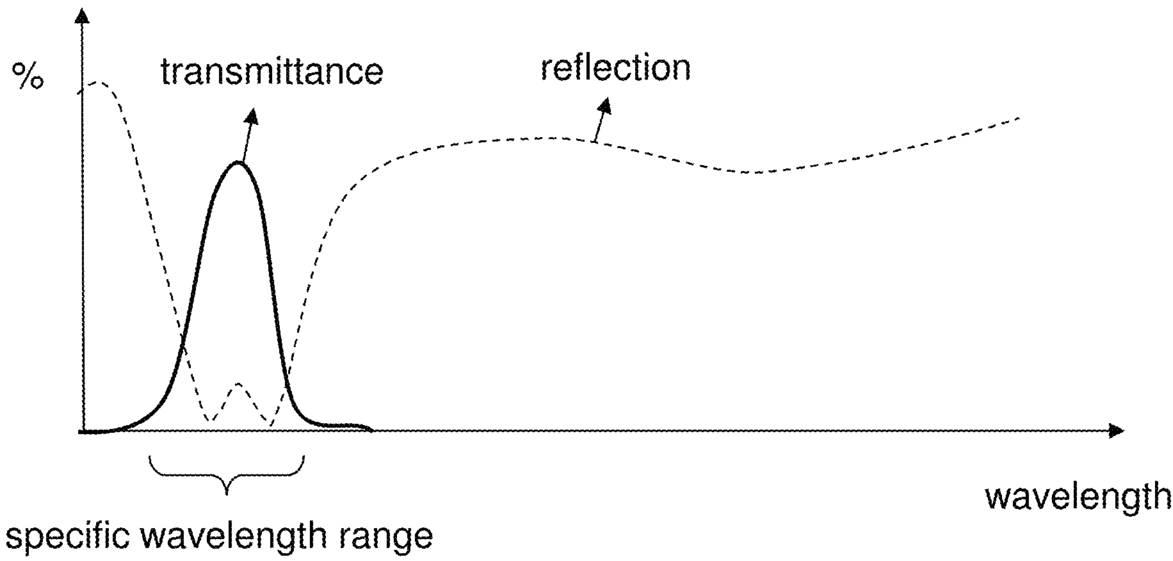
FIG. 3 illustrates an example of the material characteristics of a partially reflective filter layer in accordance with the present invention.

Referring to FIG. 2, as shown, the photocell device 10 of the present invention includes a partially reflective filter layer 11, a gain layer 12, and an optoelectronic reaction layer 14. The partially reflective filter layer 11 is made of a material that is transmissive to light within a specific wavelength range but reflective to other wavelengths. For example, referring to FIG. 3, the material shown has high transmittance for light in a specific wavelength range, while other wavelengths of light are reflected. The specific wavelength range of light may include, but is not limited to, short-wavelength light. In one embodiment, the specific wavelength range of light may include, but is not limited to, light in the 200-400 nm wavelength range. A multilayer composite film composed of different dielectric materials, or a combination of dielectric materials and metallic materials, can be used as the partially reflective filter layer 11 to achieve high transmittance for light in the specific wavelength range while reflecting other wavelengths. Various filter layers such as IR-Cut, IR-Pass, and UV-Cut already possess such properties. The design of the multilayer composite film used as the partially reflective filter layer 11 can be tailored based on the wavelength for which the photocell device 10 is intended. For instance, if the photocell device is intended to be responsive to light in the 200-400 nm wavelength range, the partially reflective filter layer 11 can be designed to have high transmittance for this wavelength range while reflecting other wavelengths.

Returning to FIG. 2, when a light beam (as indicated by the hollow arrow in FIG. 2) is directed at the partially reflective filter layer 11, photons in the specific wavelength range will pass through the partially reflective filter layer 11 and enter the gain layer 12. Some of the photons will then reach the optoelectronic reaction layer 14 and undergo the photoelectric effect, as shown in the far right of the figure (as shown by "A" in FIG. 2). The responsivity of the optoelectronic reaction layer 14 to the photoelectric effect depends on the material of the optoelectronic reaction layer 14 and the wavelength of the light. For instance, when the optoelectronic reaction layer 14 is made of silicon, it has a higher responsivity to wavelengths in the range of approximately 500 to 800 nm, a lower responsivity to wavelengths below approximately 400 nm, and cannot perform photoelectric conversion for wavelengths above approximately 1150 nm. Therefore, in the prior art, if a photocell device were to be used to detect wavelengths below 400 nm or above 800 nm, materials other than silicon would typically be used for the optoelectronic reaction layer 14. However, silicon has significant advantages in semiconductor manufacturing processes and integration with integrated circuits, making it more favorable than other materials. In the prior art, using silicon required accepting the lower responsivity for certain wavelengths.

In contrast to the prior art, the present invention overcomes these limitations and achieves significantly higher responsivity. Referring again to FIG. 2, after photons enter the gain layer 12 and reach the optoelectronic reaction layer 14, some will be directly absorbed by the optoelectronic reaction layer 14, while others will be reflected by the interface between the gain layer 12 and the optoelectronic reaction layer 14 (as shown by "A'" in FIG. 2), returning to the gain layer 12. In the gain layer 12, these photons interact with the gain layer 12 and undergo incomplete photoelectric effects, resulting in energy level changes that produce one or more photons of different wavelengths (as shown by "B" in FIG. 2). Some of these newly generated photons, now with different wavelengths (for example, within the range of 500 to 800 nm), will travel downward and re-enter the optoelectronic reaction layer 14, where they have a high likelihood of successfully undergoing photoelectric conversion (as shown by "C'" in FIG. 2). Other photons, now with different wavelengths, will travel upward and reach the interface between the gain layer 12 and the partially reflective filter layer 11. Since the partially reflective filter layer 11 only allows specific wavelengths to pass through, these photons, now with different wavelengths, will be reflected (as shown by "C" in FIG. 2) and will re-enter the optoelectronic reaction layer 14, where they again have a high chance of successfully undergoing photoelectric conversion (as shown by "D" in FIG. 2).

Additionally, some photons that initially enter the gain layer 12 may undergo incomplete photoelectric effects before reaching the optoelectronic reaction layer 14, resulting in energy level changes and the production of one or more photons with different wavelengths (as shown by "E" in FIG. 2). Photons that travel upward will be reflected by the partially reflective filter layer 11 (as shown by "F" in FIG. 2) and will re-enter the optoelectronic reaction layer 14 (as shown by "G" in FIG. 2). Photons that travel downward will have a high chance of successfully undergoing photoelectric conversion upon entering the optoelectronic reaction layer 14 (as shown by "F'" in FIG. 2). Furthermore, if any photons with altered wavelengths are reflected by the interface between the gain layer 12 and the optoelectronic reaction layer 14, they will be reflected again by the partially reflective filter layer 11 and have another opportunity to enter the optoelectronic reaction layer 14 for photoelectric conversion (as shown by "H" in FIG. 2). In this way, the partially reflective filter layer 11, the gain layer 12, and the optoelectronic reaction layer 14 form a responsivity amplifying structure, significantly improving photoelectric conversion efficiency. Using the amount of incident light in a specific wavelength range (for example, but not limited to, the 200-400 nm range) as a parameter, the present invention can achieve responsivity exceeding 100%, as one photon within the 200-400 nm range can generate multiple photons of different wavelengths that are more likely to undergo successful photoelectric conversion in the optoelectronic reaction layer 14.

According to the present invention, the gain layer 12 suitable for the embodiment in FIG. 2 can be made of materials including, but not limited to, the following: ZnS; ZnxCd(1−x)S; CdS; CdSe; CuInS2-CdS; Sr2SiO4 doped with Eu2+; Y3Al5O12 doped with Ce3+; ternary sulfides doped with rare-earth ions, such as Ca2SiS4 and Ba2SiS4; rare-earth ion-doped fluorosulfides or rare-earth ion-doped fluoroxysulfides, such as Y3S2OF3, La2CaF4S, and La2SrF4S; the doped rare-earth ions may include, but are not limited to, Mn2+, Ce3+, or Eu2+.

Figure 4:
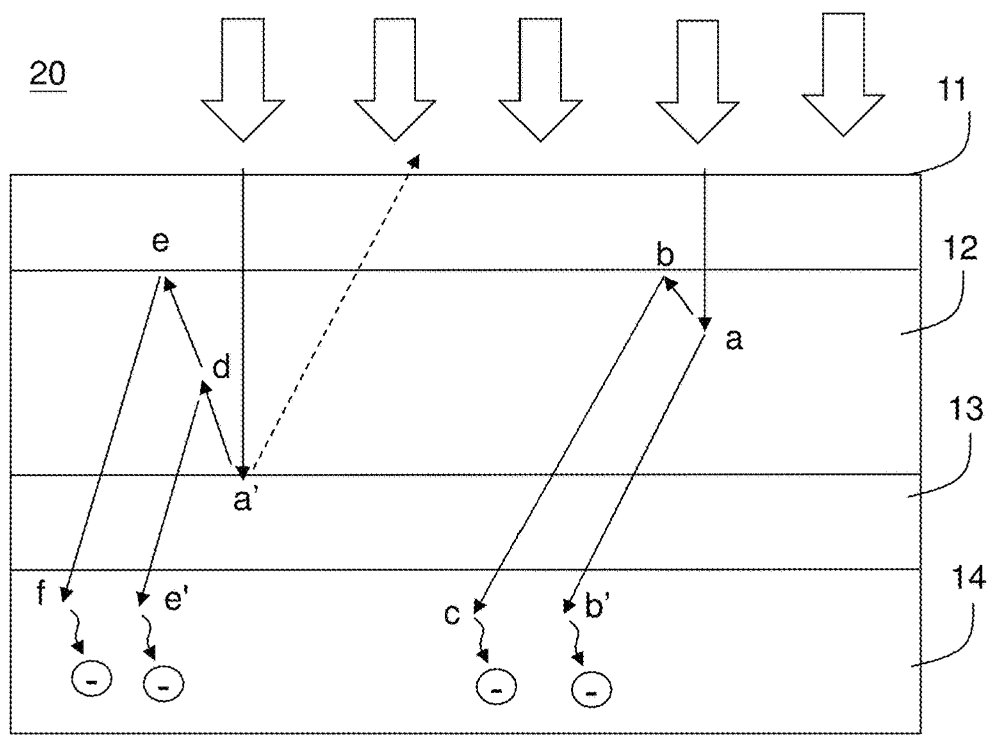
FIG. 4 shows another embodiment of the photocell device according to the present invention.
Figure 5:
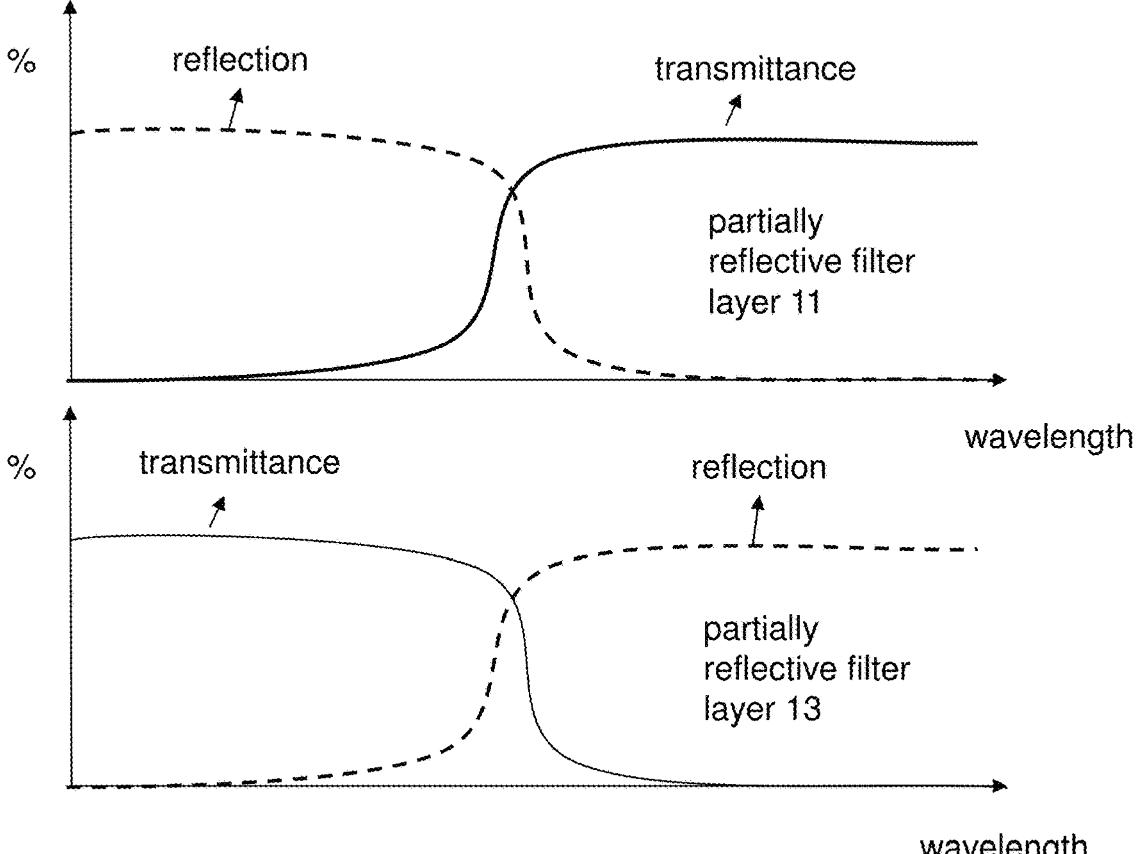
FIG. 5 illustrates an example of the material characteristics of the partially reflective filter layer corresponding to the embodiment in FIG. 4.

Referring to FIG. 4, this shows another embodiment of the present invention. This photocell device 20, for example, can be applied to photocell devices requiring responsivity to long-wavelength light (for example, but not limited to, light in the wavelength range exceeding 1150 nm). The photocell device 20 includes a partially reflective filter layer 11, a gain layer 12, a second partially reflective filter layer 13, and an optoelectronic reaction layer 14. In this embodiment, both the upper and lower sides of the gain layer 12 are provided with partially reflective filter layers 11 and 13. The design of the transmittance for specific wavelengths and the reflectance for other wavelengths of the partially reflective filter layers 11 and 13 can be as illustrated in FIG. 5. Specifically, referring to FIG. 5, the partially reflective filter layer 11 has the characteristics shown at the top of the figure, allowing long-wavelength light (for example, light exceeding 1150 nm) to pass through while reflecting shorter wavelength light (for example, below 1150 nm). The partially reflective filter layer 13 has the characteristics shown at the bottom of the figure, reflecting long-wavelength light (for example, exceeding 1150 nm) while allowing shorter wavelength light (for example, below 1150 nm) to pass through.

Returning to FIG. 4, when the light beam (as indicated by the hollow arrow in FIG. 4) strikes the partially reflective filter layer 11, photons within the long-wavelength range will pass through the partially reflective filter layer 11 and enter the gain layer 12. Some of the photons, after entering the gain layer 12, will interact with the gain layer 12, undergoing incomplete photoelectric effects and causing energy level changes that result in one or more photons with different wavelengths (as shown by "a" in FIG. 4). Some of these photons, now with different wavelengths (for example, within the 400-900 nm range), will travel downward and pass through the partially reflective filter layer 13 into the optoelectronic reaction layer 14, where they have a high likelihood of successfully undergoing photoelectric conversion (as shown by "b'" in FIG. 4). Other photons, with changed wavelengths, will travel upward to the interface between the gain layer 12 and the partially reflective filter layer 11 and will be reflected (as shown by "b" in FIG. 4), passing through the partially reflective filter layer 13 into the optoelectronic reaction layer 14, again having a high likelihood of successful photoelectric conversion (as shown by "c" in FIG. 4). Some photons may directly reach the interface between the gain layer 12 and the partially reflective filter layer 13 (as shown by "a'" in FIG. 4); since these photons are long-wavelength, they will be reflected by the partially reflective filter layer 13 back into the gain layer 12, where they have a good chance of interacting with the gain layer 12 and converting into one or more photons with different wavelengths (as shown by "d" in FIG. 4), with subsequent interactions similar to those described previously, as shown by "e'", "e", and "f" in FIG. 4. Of course, some photons may remain in their long-wavelength form and pass through the partially reflective filter layer 11 and dissipate, as indicated by the dashed arrow in the figure.

In the prior art, it was nearly impossible to detect light with a wavelength exceeding 1150 nm using an optoelectronic reaction layer 14 made of silicon. However, the present invention overcomes this limitation and enables such detection. Therefore, whether for short or long wavelengths, the present invention significantly improves photoelectric conversion efficiency.

According to the present invention, the gain layer 12 suitable for the embodiment in FIG. 4 may be made of materials including, but not limited to, Y2O3, BaGdF5, SrYbF5, or other nanoparticles or crystals doped with lanthanide element ions, or glass materials doped with lanthanide element ions. The doped lanthanide ions may include, but are not limited to, Er3+, Yb3+, or Tm3+.

Figure 6:
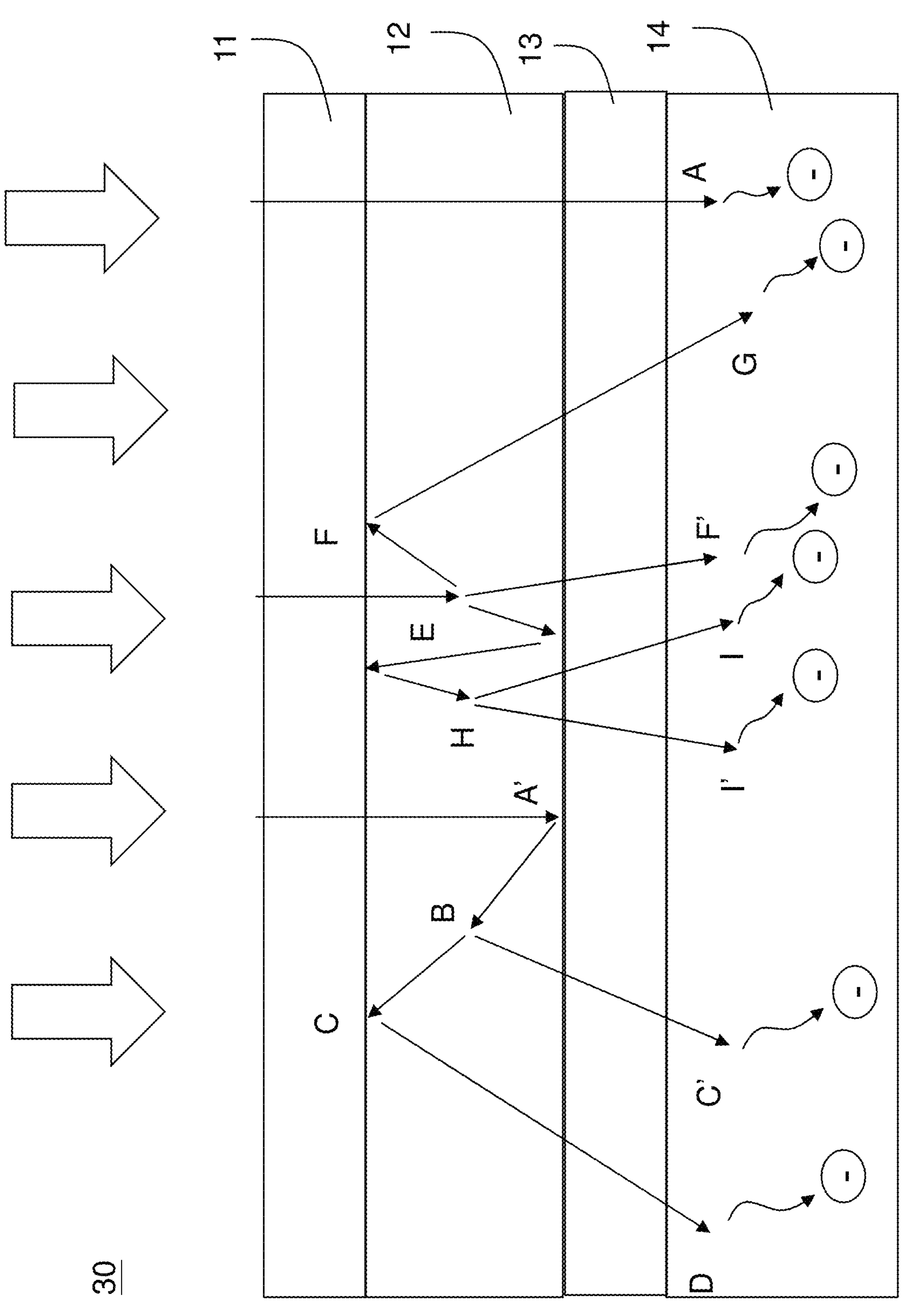
FIG. 6 shows another embodiment of the photocell device according to the present invention.
Figure 7A:
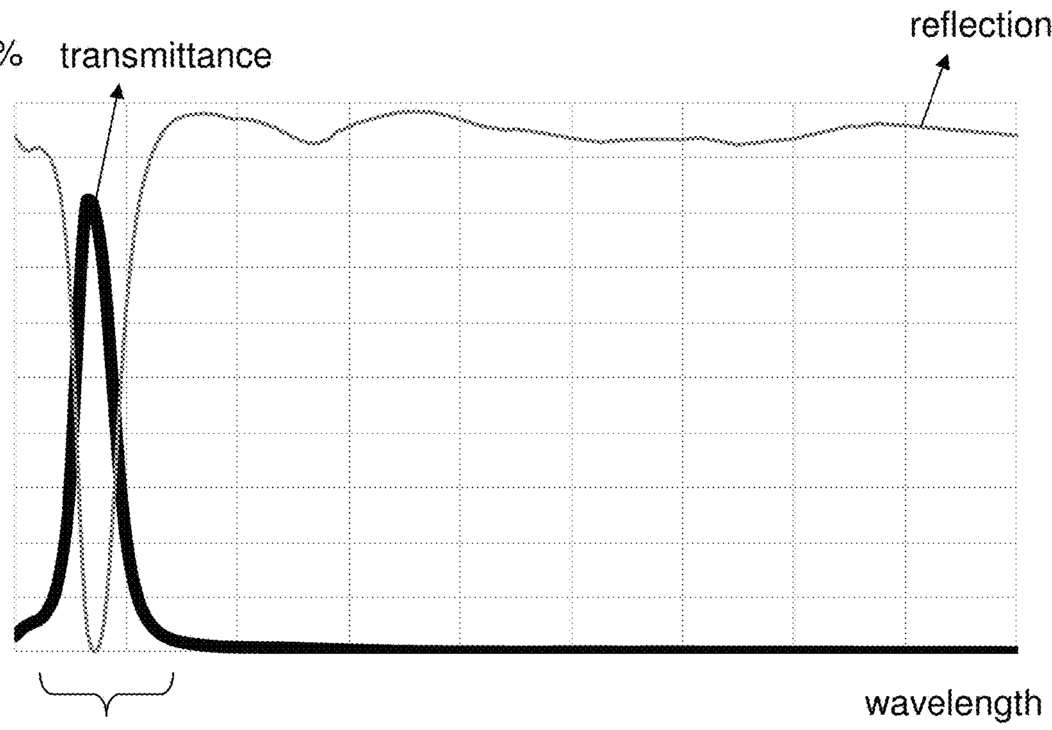
FIGS. 7A and 7B illustrate examples of the material characteristics of the partially reflective filter layer corresponding to the embodiment in FIG. 6.
Figure 7B:
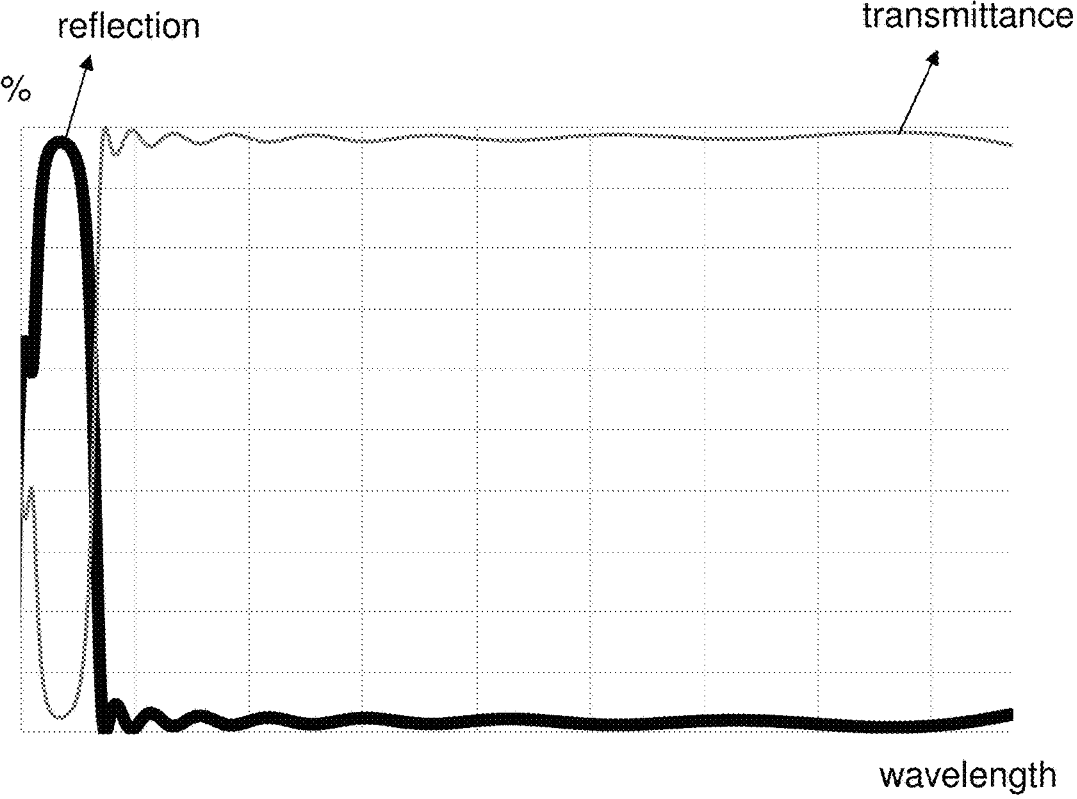

Referring to FIG. 6, this shows another embodiment of the present invention. This photocell device 30, for example, can be applied to photocell devices requiring responsivity to short-wavelength light (for example, but not limited to, light in the wavelength range of 200-400 nm). As shown, the photocell device 30 of the present invention includes a partially reflective filter layer 11, a gain layer 12, a second partially reflective filter layer 13, and an optoelectronic reaction layer 14. The partially reflective filter layer 11 is composed of a material that is transmissive to light within a specific wavelength range but reflective to other wavelengths. For example, referring to FIG. 7A, the material shown has high transmittance for the specified short-wavelength light, while other wavelengths are reflected. Referring to FIG. 7B, the material shown has high transmittance for the specified long-wavelength light, while other wavelengths are reflected. The specific short-wavelength range may include, but is not limited to, light in the short-wavelength range, where in one embodiment, the specific short-wavelength range may include, but is not limited to, light within the 200-400 nm wavelength range. A multilayer composite film composed of different dielectric materials or a combination of dielectric materials and metallic materials can be used as the partially reflective filter layer 11 to achieve high transmittance for light in the specific wavelength range while reflecting other wavelengths. Various filter layers such as IR-Cut, IR-Pass, and UV-Cut already possess such properties.

The appropriate design of the multilayer composite film for the partially reflective filter layers 11 and 13 depends on the wavelength range in which the photocell device 30 is intended to operate. For instance, if the photocell device is intended to operate in the 200-400 nm wavelength range, the partially reflective filter layer 11 can be designed to have high transmittance for this wavelength range while reflecting other wavelengths. Conversely, the partially reflective filter layer 13 can be designed to have high transmittance for the wavelength range with higher responsivity in the optoelectronic reaction layer 14, while reflecting other wavelengths.

In this embodiment, both the upper and lower sides of the gain layer 12 are provided with partially reflective filter layers 11 and 13. The design of the transmittance and reflectance for specific wavelength ranges of the partially reflective filter layers 11 and 13, as shown in FIG. 6, is tailored accordingly. Specifically, referring to FIG. 6, the partially reflective filter layer 11 has the characteristics illustrated in FIG. 7A, allowing short-wavelength light (for example, light in the 200-400 nm wavelength range) to pass through while reflecting longer-wavelength light (for example, wavelengths greater than 400 nm). The partially reflective filter layer 13 has the characteristics illustrated in FIG. 7B, reflecting short-wavelength light (for example, within the 200-300 nm range) while allowing longer-wavelength light (for example, wavelengths greater than 300 nm) to pass through.

Returning to FIG. 6, when the light beam (as indicated by the hollow arrow in FIG. 6) strikes the partially reflective filter layer 11, photons in the specific wavelength range will pass through the partially reflective filter layer 11 and enter the gain layer 12. Some of these photons will reach the optoelectronic reaction layer 14, undergoing the photoelectric effect, as shown by “A” on the right side of FIG. 6. The responsivity of the optoelectronic reaction layer 14 to the photoelectric effect depends on the material and the wavelength of the light.

Compared to the prior art, the present invention significantly improves responsivity, as it overcomes the limitations described earlier. Referring again to FIG. 6, after photons enter the gain layer 12 and pass through the partially reflective filter layer 13 to reach the optoelectronic reaction layer 14, some photons will directly enter the optoelectronic reaction layer 14, while others will be reflected by the interface between the gain layer 12 and the partially reflective filter layer 13 (as shown by “A'” in FIG. 6), returning to the gain layer 12. In the gain layer 12, these photons will interact with the gain layer 12, undergoing incomplete photoelectric effects and generating one or more photons with different wavelengths (as shown by “B'” in FIG. 6). Some of these photons, now with different wavelengths (for example, in the 500-800 nm range), will travel downward and re-enter the optoelectronic reaction layer 14, where they have a high likelihood of successfully undergoing photoelectric conversion (as shown by “C'” in FIG. 6). Other photons, with changed wavelengths, will travel upward to the interface between the gain layer 12 and the partially reflective filter layer 11. Since the partially reflective filter layer 11 only allows specific wavelengths to pass through (for example, shorter wavelengths), these photons, now with different wavelengths, cannot pass through and will be reflected (as “C” in FIG. 6), re-entering the optoelectronic reaction layer 14, where they have a high likelihood of successfully undergoing photoelectric conversion (as shown by “D” in FIG. 6).

Additionally, some photons that initially enter the gain layer 12 may interact with the gain layer 12 before reaching the optoelectronic reaction layer 14, converting into one or more photons with different wavelengths (as shown by “E” in FIG. 6). Photons traveling upward will be reflected by the partially reflective filter layer 11 (as shown by “F” in FIG. 6) and will re-enter the optoelectronic reaction layer 14 (as shown by “G” in FIG. 6). Photons traveling downward have a high chance of successfully undergoing photoelectric conversion (as shown by “F'” in FIG. 6). Furthermore, if any photons with altered wavelengths are reflected by the interface between the gain layer 12 and the partially reflective filter layer 13, they will be reflected again by the partially reflective filter layer 11, having another opportunity to interact with the gain layer 12 and generate one or more photons with different wavelengths (as shown by “H” in FIG. 6). Some of these photons, now with different wavelengths (for example, in the 500-800 nm range), will travel downward and re-enter the optoelectronic reaction layer 14, where they have a high likelihood of successfully undergoing photoelectric conversion (as shown by “I” and “I'” in FIG. 6). From one perspective, in the present invention, the partially reflective filter layer 11, the gain layer 12, the second partially reflective filter layer 13, and the optoelectronic reaction layer 14 form a responsivity amplifying structure, significantly improving photoelectric conversion efficiency. Using the amount of incident light within a specific wavelength range (for example, but not limited to, the 200-400 nm wavelength range) as a parameter, the present invention can achieve responsivity exceeding 100%, as one photon in the 200-400 nm wavelength range may generate multiple photons of different wavelengths that are more likely to undergo successful photoelectric conversion in the optoelectronic reaction layer 14.

According to the present invention, the gain layer 12 suitable for the embodiment in FIG. 6 may be made of materials including, but not limited to, ZnS, ZnxCd(1−x)S, CdS, CdSe, CuInS2-CdS, Sr2SiO4 doped with Eu2+, Y3Al5O12 doped with Ce3+, ternary sulfides doped with rare-earth ions, such as Ca2SiS4, Ba2SiS4, rare-earth ion-doped fluorosulfides or rare-earth ion-doped fluoroxysulfides, such as Y3S2OF3, La2CaF4S, and La2SrF4S. The doped rare-earth ions may include, but are not limited to, Mn2+, Ce3+, or Eu2+.

It should be noted that, in the above embodiments, the gain layer 12 may also be filled with up-conversion nanoparticles (up-conversion nano particles). Up-conversion nanoparticles are well-known to those skilled in the art and represent a common technique within the technical scope of the present invention. Up-conversion nanoparticles are widely used in various optoelectronic applications, and their mechanism is well understood. These nanoparticles are capable of converting two low-energy photons into one high-energy photon. This technique can be applied to the present invention to enhance photoelectric conversion efficiency, and thus, the details of up-conversion nanoparticles are not repeated here.

It should be noted that, according to the present invention, the transmittance and reflectance wavelength ranges of the first partially reflective filter layer are designed according to the wavelength range of the light to be detected, i.e., the specific wavelength range of the light. For example, to detect light in the short-wavelength range, the filter layer is designed to allow short-wavelength light to pass through while reflecting long-wavelength light. Once the photons enter the gain layer, the gain layer is designed to convert the wavelength of the photons, ensuring that short-wavelength light is converted into wavelengths suitable for optimal photoelectric response in the optoelectronic reaction layer. The transmittance and reflectance wavelength ranges of the second partially reflective filter layer are designed to match the wavelength range in which the optoelectronic reaction layer exhibits optimal responsivity, allowing these wavelengths to pass through while reflecting others. In one embodiment, the second partially reflective filter layer reflects the specific wavelength range of light, ensuring that the light fully interacts with the gain layer to convert into other wavelengths. The second filter layer then reflects this light back for further interaction with the gain layer.

It should be noted that the transmittance and reflectance wavelength ranges of the first partially reflective filter layer are designed according to the wavelength range of the light to be detected, while the transmittance and reflectance wavelength ranges of the second partially reflective filter layer are designed according to the wavelength range in which the optoelectronic reaction layer has the highest responsivity. Therefore, the transmittance and reflectance wavelength ranges of the first and second partially reflective filter layers may be independent of each other.

Note that in the present invention, the term “short wavelength range” refers, in one embodiment, specifically to the UV spectrum, which includes wavelengths from 10 nm to 400 nm (commonly recognized as the ultraviolet range). In another embodiment, the short wavelength range can also refer to the combined UVA, UVB, and UVC spectrum, covering wavelengths from 200 nm to 400 nm.

Furthermore, in the present invention, the term "long wavelength range" specifically refers to NIR (Near Infrared) and SWIR (Short-Wave Infrared). NIR generally refers to wavelengths from 700 nm or 750 nm to 1000 nm, while SWIR typically refers to wavelengths from 1000 nm to 2500 nm or 2700 nm.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, the wavelength ranges mentioned are not limited to those described in the embodiments and may be defined in other ranges. Additionally, other layers, such as a light lens layer, may be added beyond the layers shown. Furthermore, those skilled in this art can readily conceive variations and modifications within the spirit of the present invention. The spirit of the present invention should cover all such and other modifications and variations, which should be interpreted to fall within the scope of the following claims and their equivalents.

What is claimed is:

1. A photocell device having a responsivity amplifying structure, comprising:

a first partially reflective filter layer configured to transmit light within a specific wavelength range and reflect light outside the specific wavelength range;

a gain layer, which is configured to interact with photons to alter the wavelength of the photons;

a second partially reflective filter layer configured to reflect light within the specific wavelength range and transmit light outside the specific wavelength range; and an optoelectronic reaction layer;

wherein the gain layer is located between the first and second partially reflective filter layers, and the second partially reflective filter layer is located between the gain layer and the optoelectronic reaction layer;

wherein when a photon passes through the first partially reflective filter layer and enters the gain layer, it interacts with the gain layer to generate one or more photons of a different wavelength that enter the optoelectronic reaction layer for optoelectronic conversion; when a photon passes through the first partially reflective filter layer and enters the gain layer, it can be reflected by the second partially reflective filter layer and re-enter the gain layer to interact with it, generating one or more photons of a different wavelength that enter the optoelectronic reaction layer for optoelectronic conversion.

2. The photocell device having a responsivity amplifying structure as claimed in claim 1, wherein the specific wavelength range of light is in a long wavelength range.

3. The photocell device having a responsivity amplifying structure as claimed in claim 2, wherein the specific wavelength range of light is greater than 1150 nm.

4. The photocell device having a responsivity amplifying structure as claimed in claim 1, wherein the specific wavelength range of light is in a short wavelength range.

5. The photocell device having a responsivity amplifying structure as claimed in claim 4, wherein the specific wavelength range of light is within a range of 200 to 400 nm.

6. The photocell device having a responsivity amplifying structure as claimed in claim 1, wherein the material of the gain layer comprises one or more of the following:

ZnS; ZnxCd(1−x)S; CdS; CdSe; CuInS2-CdS; Sr2SiO4 doped with Eu2+; Y3Al5O12 doped with Ce3+; Ca2Sis4 doped with rare-earth ions; Ba2SiS4 doped with rare-earth ions; Y3S2OF3 doped with rare-earth ions; La2CaF4S doped with rare-earth ions; or La2SrF4S doped with rare-earth ions;

wherein the doped rare-earth ions comprise Mn2+, Ce3+, or Eu2+.

7. The photocell device having a responsivity amplifying structure as claimed in claim 1, wherein the partially reflective filter layers are multilayer composite films formed by combining different dielectric materials or combining dielectric materials with metallic materials.

8. The photocell device having a responsivity amplifying structure as claimed in claim 1, wherein the material of the gain layer comprises one or more of the following:

Y2O3 nanoparticles or crystals doped with lanthanide element ions; BaGdF5 nanoparticles or crystals doped with lanthanide element ions; SrYbF5 nanoparticles or crystals doped with lanthanide element ions; or glass materials doped with lanthanide element ions;

wherein the doped lanthanide ions comprise Er3+, Yb3+, or Tm3+.

* * * * *